United States Patent
Koo et al.

(10) Patent No.: US 11,457,528 B2
(45) Date of Patent: Sep. 27, 2022

(54) ELECTRONIC DEVICE HAVING CONDUCTIVE STRUCTURE OF SUPPORTING MEMBER

(71) Applicant: Samsung Electronics Co., Ltd., Suwon-si (KR)

(72) Inventors: Jamyeong Koo, Suwon-si (KR); Jaedeok Lim, Suwon-si (KR); Hyein Park, Suwon-si (KR); Gyuyeong Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 173 days.

(21) Appl. No.: 16/894,094

(22) Filed: Jun. 5, 2020

(65) Prior Publication Data

US 2020/0389970 A1 Dec. 10, 2020

(30) Foreign Application Priority Data

Jun. 5, 2019 (KR) .................. 10-2019-0066559

(51) Int. Cl.
*H01Q 1/24* (2006.01)
*H05K 1/02* (2006.01)
(Continued)

(52) U.S. Cl.
CPC ......... *H05K 1/0243* (2013.01); *H01Q 1/1207* (2013.01); *H05K 3/305* (2013.01); *H05K 3/308* (2013.01); *H01Q 1/243* (2013.01)

(58) Field of Classification Search
CPC ... H01Q 1/12–24; H01Q 1/243; H05K 1/0243
See application file for complete search history.

(56) References Cited

U.S. PATENT DOCUMENTS 7,933,123 B2 4/2011 Wang et al.
8,922,439 B2 12/2014 Sung et al.
(Continued)

FOREIGN PATENT DOCUMENTS

CN 108141981 A 6/2018
EP 3 344 022 A1 7/2018
(Continued)

OTHER PUBLICATIONS

International Search Report dated Sep. 29, 2020, issued in International Application No. PCT/KR2020/007311.
(Continued)

*Primary Examiner* — Hasan Islam
(74) *Attorney, Agent, or Firm* — Jefferson IP Law, LLP

(57) ABSTRACT

An electronic device is provided. The electronic device includes an electronic device including a housing including a front plate, a rear plate, and a member surrounding at least part of a space between the front plate and the rear plate and operating as an antenna radiator by being formed of a metal material at least in part, a support member including a first face and a second face, disposed between a display and the rear plate, supporting the display on the first face, and bonded to part of the side member, a printed circuit board, a housing groove formed on a first portion of the member, a conductive body bonded to the housing groove through a press-fit process, and a connection terminal disposed on the printed circuit board and electrically coupling the press-fitted conductive body to the printed circuit board.

20 Claims, 20 Drawing Sheets

(51) Int. Cl.
*H01Q 1/12* (2006.01)
*H05K 3/30* (2006.01)

(56) References Cited

U.S. PATENT DOCUMENTS

| | | | |
|---|---|---|---|
| 2011/0273342 A1* | 11/2011 | Park | H01Q 9/0421 |
| | | | 343/702 |
| 2012/0056789 A1* | 3/2012 | Sohn | H01Q 1/44 |
| | | | 343/702 |
| 2015/0062847 A1 | 3/2015 | Park | |
| 2018/0310423 A1 | 10/2018 | Koo et al. | |
| 2019/0132973 A1 | 5/2019 | Lee et al. | |
| 2019/0221919 A1 | 7/2019 | Koo et al. | |

FOREIGN PATENT DOCUMENTS

| | | |
|---|---|---|
| KR | 10-2011-0000252 A | 1/2011 |
| KR | 10-1400846 B1 | 5/2014 |
| KR | 10-2016-0063214 A | 6/2016 |
| KR | 10-2017-0048043 A | 5/2017 |
| KR | 10-2018-0024583 A | 3/2018 |
| WO | 2017/073893 A1 | 5/2017 |
| WO | 2018/043986 A1 | 3/2018 |

OTHER PUBLICATIONS

Extended European Search Report dated Apr. 4, 2022, issued in European Patent Application No. 20818138.8.

* cited by examiner

ELECTRONIC DEVICE HAVING CONDUCTIVE STRUCTURE OF SUPPORTING MEMBER

CROSS-REFERENCE TO RELATED APPLICATION(S)

This application is based on and claims priority under 35 U.S.C. § 119(a) of a Korean patent application number 10-2019-0066559, filed on Jun. 5, 2019, in the Korean Intellectual Property Office, the disclosure of which is incorporated by reference herein in its entirety.

BACKGROUND

1. Field

The disclosure relates to a conductive structure of a supporting member operating as an antenna radiator in a housing structure of an electronic device.

2. Description of Related Art

More and more electronic devices are produced to be light in weight by adopting a pure metal or alloy material with relatively low corrosion resistance or low surface hardness such as aluminum, titanium, zinc, magnesium, or the like, or by adopting a stainless steel material with strong corrosion resistance but subject to surface oxidation or pitting corrosion during a manufacturing process.

Such a material is advantageous in terms of structural rigidity and aesthetics in comparison with plastic products, and thus is increasingly adopted in the electronic devices of the related art.

In addition, such an electronic device has an advantage in that, when a metal material is used as an exterior case, the entirety or part of the case can be used as an antenna radiator or a circuitry.

However, a metal material for an exterior is composed of metal such as aluminum, magnesium, titanium, zinc, iron, nickel, or chromium, or an alloy material containing the metal, and may be subject to galvanic corrosion when a surface is directly in contact with a contact terminal formed of gold, or a metal material with corrosion resistance similar to gold or plated with such a material.

In addition, when directly in contact with the contact terminal formed of a more corrosion resistant material or a harder material than a case metal material, fretting corrosion or the like occurs, that is, the case material is repeatedly scratched due to galvanic corrosion caused by a connection between different metals or due to drops or vibrations occurring while using the electronic device. Therefore, antenna performance deterioration or wrong contacts may result in an abnormal operation of the device.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device capable of utilizing the entirety of a conductive body as a contact portion, which is advantageous for making the electronic device light, thin, short, and small.

Another aspect of the disclosure is to provide an electronic device supporting a thin connection structure between a printed circuit board and a conductive member operating as a radiator.

Another aspect of the disclosure is to provide an electronic device supporting a thin connection structure between a printed circuit board and a feeding portion operating as a radiator.

Another aspect of the disclosure is to provide an electronic device in which at least one protrusion or a contact structure having a shape similar thereto is formed on an outer face of a conductive body to be press-fitted and a contact area for a portion of a side member operating as an antenna radiator is expanded to provide connection reliability.

Another aspect of the disclosure is to provide an electronic device in which a press-fitted conductive body is sealed by using an adhesive including conductive materials and a contact area is expanded to provide connection reliability.

Various embodiments of the disclosure can be applied to an intermediate region between a metal structure and a non-metal structure, thereby providing an electronic device in which a degree of freedom is improved in terms of a design for constructing a connection structure of an antenna radiator.

Additional aspects will be set forth in part in the description which follows and, in part, will be apparent from the description, or may be learned by practice of the presented embodiments.

In accordance with an aspect of the disclosure, an electronic device is provided. The electronic device includes an electronic device including a housing including a front plate facing a first direction, a rear plate facing a second direction opposite to the first direction, and a member surrounding at least part of a space between the front plate and the rear plate and operating as an antenna radiator by being formed of a metal material at least in part, a support member including a first face facing the first direction and a second face facing the second direction, disposed between a display and the rear plate, supporting the display on the first face, and bonded to part of the side member, a printed circuit board disposed between the support member and the rear plate, and supported on the second face, a housing groove formed on a first portion of the member, a conductive body bonded to the housing groove through a press-fit process, and a connection terminal disposed on the printed circuit board and electrically coupling the press-fitted conductive body to the printed circuit board.

In accordance with another aspect of the disclosure, an electronic device is provided. The electronic device includes a housing including a front plate facing a first direction, a rear plate facing a second direction opposite to the first direction, and a member surrounding at least part of a space between the front plate and the rear plate, operating as an antenna radiator by being formed of a metal material, and including at least one feeding portion or at least one ground portion protruding in a direction perpendicular to the first and second directions, a support member disposed between a display and the rear plate, supporting the display in the first direction, and bonded to at least part of the member, a printed circuit board disposed between the support member and the rear plate, and supported by the support member, a housing groove formed on the member, a conductive body bonded to the housing groove through a press-fit process, and a connection terminal disposed on the printed circuit board to electrically couple the press-fitted conductive body to the printed circuit board.

According to aspects of the disclosure, there may be an advantage in making an electronic device light, thin, short, and small since a thin connection structure is possible between a printed circuit board inside a housing and a side member operating as a radiator.

According to aspects of the disclosure, at least one protrusion may be formed on an outer face of a conductive body to be press-fitted to ensure contact force or contact reliability with respect to a portion of a side member operating as an antenna radiator. Alternatively, a press-fitted conductive body may be sealed by using an adhesive including conductive materials, and a contact area may be expanded to assist connection reliability.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

An electronic device according to various embodiments of the disclosure may include at least one of, for example, a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a Moving Picture Experts Group (MPEG-1) Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

Figure 1:
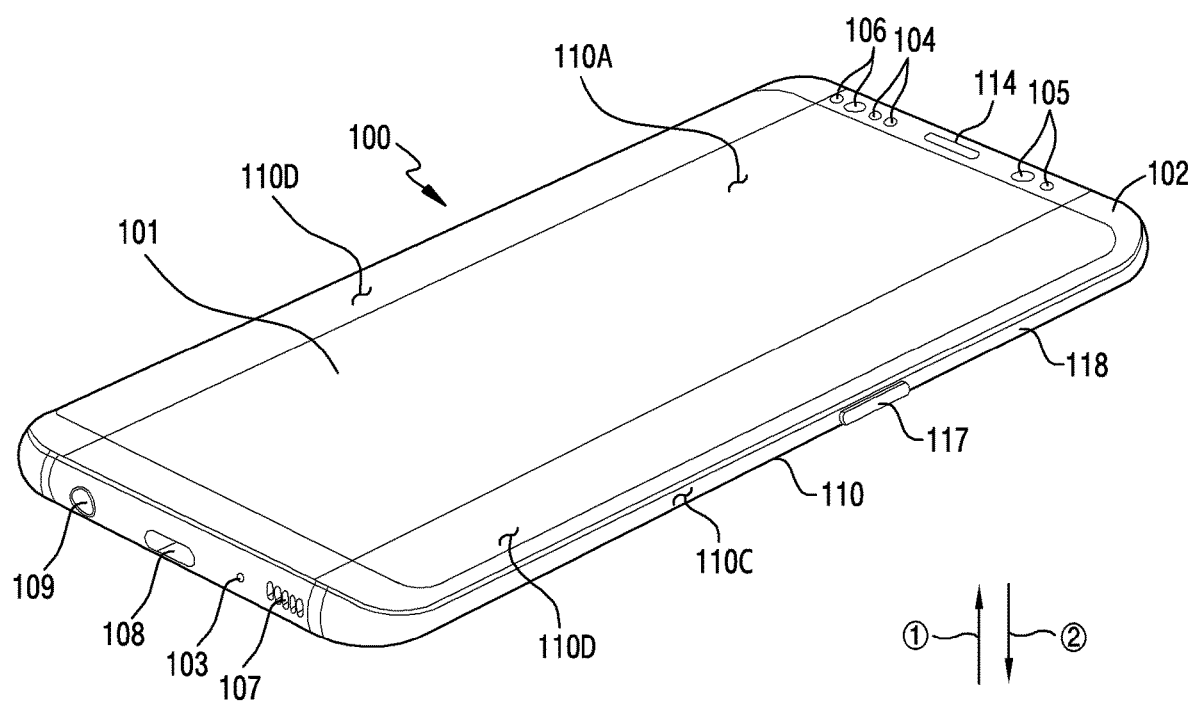
FIG. 1 is a perspective view illustrating a front face of an electronic device according to an embodiment of the disclosure.

FIG. 1 is a perspective view illustrating a front face of a mobile electronic device according to an embodiment of the disclosure.

Figure 2:
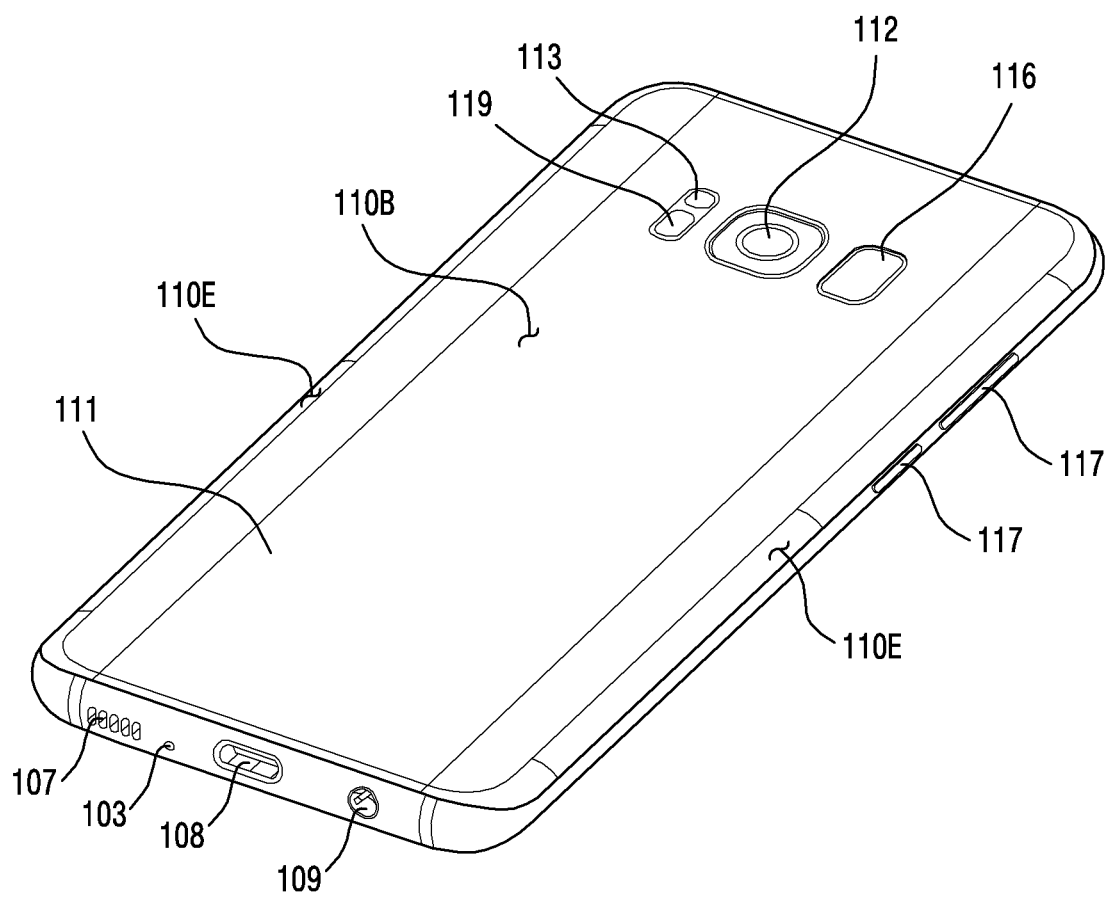
FIG. 2 is a perspective view illustrating a rear face of an electronic device of FIG. 1 according to an embodiment of the disclosure.

FIG. 2 is a perspective view illustrating a rear face of the electronic device of FIG. 1 according to an embodiment of the disclosure.

Referring to FIGS. 1 and 2, an electronic device 100 according to an embodiment may include a housing 110 including a first face (or a front face) 110A, a second face (or a rear face) 110B, and a lateral face 110C surrounding a space between the first face 100A and the second face 110B. In another embodiment (not shown), the housing may refer to a structure which constitutes part of the first face 110A, second face 110B, and lateral face 110C of FIG. 1. According to an embodiment, the first face 110A may be constructed of a front plate 102 (e.g., a polymer plate or a glass plate having various coating layers) which is at least partially transparent in practice. The second face 110B may be constructed of a rear plate 111 which is opaque in practice. For example, the rear plate 111 may be constructed of coated or colored glass, ceramic, polymer, metallic materials (e.g. aluminum, stainless steel (STS), or magnesium) or a combination of at least two of these materials. The lateral face 110C may be constructed of a lateral bezel structure (or a lateral member) 118 bonded to the front plate 102 and the rear plate 111 and including metal and/or polymer. In some embodiments, the rear plate 111 and the lateral bezel structure 118 may be constructed integrally and may include the same material (e.g., a metallic material such as aluminum).

In the illustrated embodiment, the front plate 102 may include two first regions 110D seamlessly extended by being bent from the first face 110A toward the rear plate 111 at both ends of a long edge of the front plate 102. In the illustrated embodiment (see FIG. 2), the rear plate 111 may include two second regions 110E seamlessly extended by being bent from the second face 110B toward the front plate 102 at both ends of a long edge. In some embodiments, the front plate 102 (or the rear plate 111) may include only one of the first regions 110D (or the second regions 110E). In another embodiment, some of the first regions 110D or the second regions 110E may not be included. In the above embodiments, in a lateral view of the electronic device 100, the lateral bezel structure 118 may have a first thickness (or width) at a lateral face in which the first regions 110D or the second regions 110E are not included, and may have a second thickness thinner than the first thickness at a lateral face in which the first regions 110D or the second regions 110E are included.

According to an embodiment, the electronic device 100 may include at least one or more of a display 101, audio modules 103, 107, and 114, sensor modules 104, 116, and 119, camera modules 105, 112, and 113, a key input device 117, a light emitting element 106, and connector holes 108 and 109. In some embodiments, the electronic device 100 may omit at least one of components (e.g., the key input device 117 or the light emitting element 106), or other components may be additionally included.

The display 101 may be exposed through, for example, some portions of the front plate 102. In some embodiments, at least part of the display 101 may be exposed through the first face 110A and the front plate 102 constructing the second regions 110E of the lateral face 110C. In some embodiments, a corner of the display 101 may be constructed to be substantially the same as an outer boundary adjacent to the front plate 102. In another embodiment (not shown), in order to expand an area in which the display 101 is exposed, the display 101 and the front plate 102 may be constructed to have substantially the same interval between outer boundaries thereof.

In another embodiment (not shown), a portion of a screen display region of the display 101 may have a recess or opening, and may include at least one or more of the audio module 114, sensor module 104, camera module 105, and light emitting element 106 which are aligned with the recess or the opening may be included. In another embodiment (not shown), at least one of the audio module 114, the sensor module 104, the camera module 105, the fingerprint sensor 116, and the light emitting element 106 may be included in a rear face of the screen display region of the display 101. In another embodiment (not shown), the display 101 may be disposed adjacent to or joined with a touch sensing circuit, a pressure sensor capable of measuring touch strength (pressure), and/or a digitizer for detecting a magnetic-type stylus pen. In some embodiments, at least part of the sensor modules 104 and 119 and/or at least part of the key input device 117 may be disposed to the first regions 110D and/or the second regions 110E.

The audio modules 103, 107, and 114 may include the microphone hole 103 and the speaker holes 107 and 114. The microphone hole 103 may have a microphone disposed inside thereof to acquire external sound, and in some embodiments, may have a plurality of microphones disposed to sense a sound direction. The speaker holes 107 and 114 may include the external speaker hole 107 and the communication receiver hole 114. In some embodiments, the speaker holes 107 and 114 and the microphone hole 103 may be implemented with one hole, or the speaker may be included without the speaker holes 107 and 114 (e.g., a Piezo speaker).

The sensor modules 104, 116, and 119 may generate an electrical signal or data value corresponding to an internal operational state of the electronic device 100 or an external environmental state. The sensor modules 104, 116, and 119 may include, for example, the first sensor module 104 (e.g., a proximity sensor) and/or second sensor module (not shown) (e.g., a fingerprint sensor) disposed to the first face 110A of the housing 110, and/or the third sensor module 119 (e.g., a Heart Rate Monitoring (HRM) sensor) disposed to the second face 110B of the housing 110 and/or the fourth sensor module 116 (e.g., a fingerprint sensor). The fingerprint sensor may be disposed not only to the first face 110A (e.g., the display 101) but also the second face 110B of the housing 110. The electronic device 100 may further include at least one of sensor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

The camera modules 105, 112, and 113 may include the first camera module 105 disposed to the first face 110A of the electronic device 100, the second camera module 112 disposed to the second face 110B, and/or the flash 113. The camera module 105 and 112 may include one or more lenses, an image sensor, and/or an image signal processor. The flash 113 may include, for example, a Light Emitting Diode (LED) or a xenon lamp. In some embodiments, two or more lenses (wide angle and telephoto lenses) and image sensors may be disposed to one face of the electronic device 100.

The key input device 117 may be disposed to the lateral face 110C of the housing 110. In another embodiment, the electronic device 100 may not include the entirety or part of the aforementioned key input device 117. The key input device 117, which is not included, may be implemented on a display 101 in a different form such as a soft key or the like. In some embodiments, the key input device may include the sensor module 116 disposed to the second face 110B of the housing 110.

The light emitting element 106 may be disposed, for example, to the first face 110A of the housing 110. The light emitting element 106 may provide, for example, state information of the electronic device 100 in an optical form. In another embodiment, the light emitting element 106 may provide, for example, a light source interworking with an operation of the camera module 105. The light emitting element 106 may include, for example, an LED, an Infrared (IR) LED, and a xenon lamp.

The connector holes 108 and 109 may include the first connector hole 108 capable of housing a connector (e.g., a Universal Serial Bus (USB) connector) for transmitting/receiving power and/or data of an external electronic device and/or the second connector hole (e.g., earphone jack) 109 capable of housing a connector for transmitting/receiving an audio signal with respect to the external electronic device.

Figure 3:
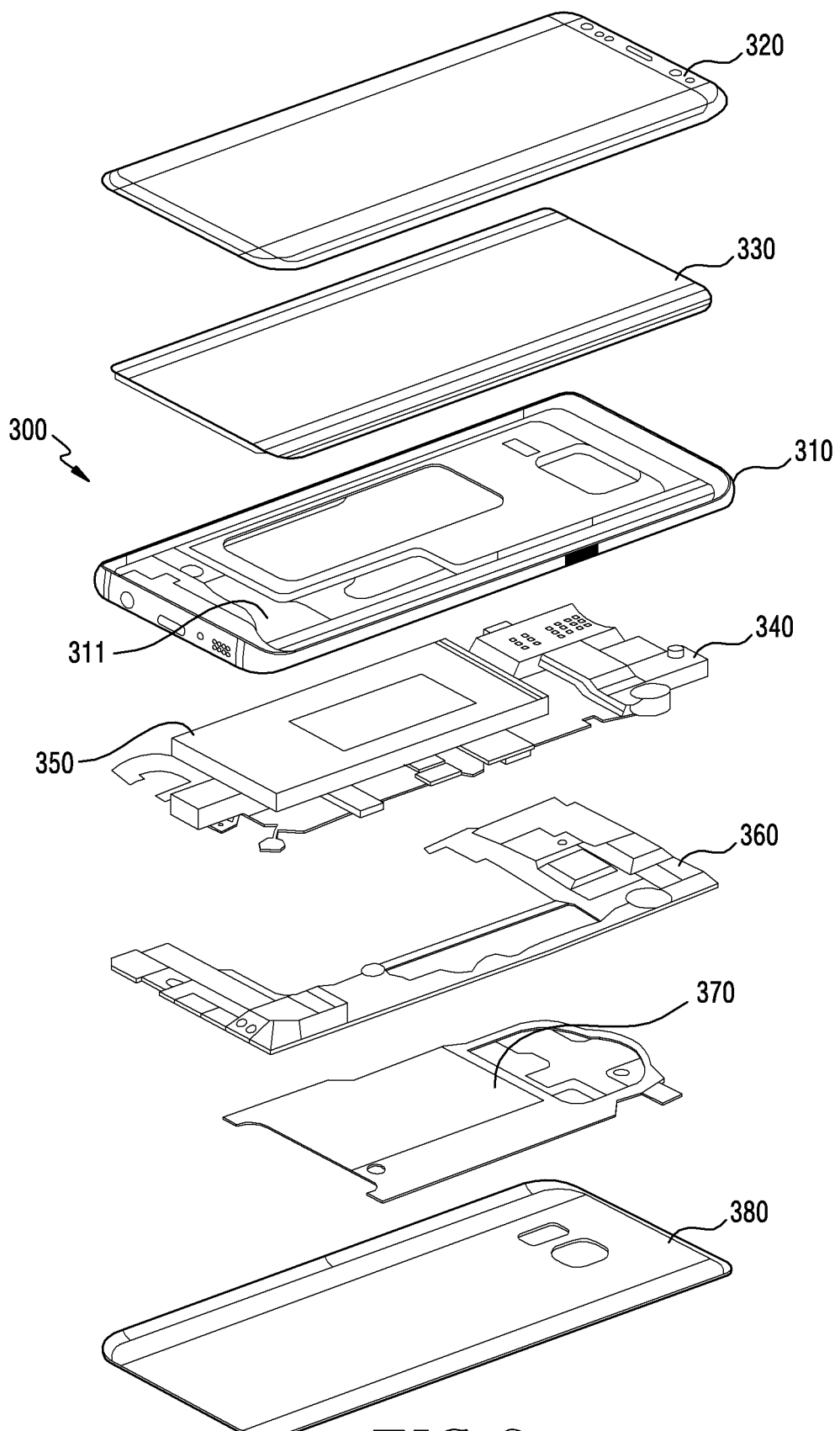
FIG. 3 is an exploded perspective view illustrating an inner structure of an electronic device of FIG. 1 according to an embodiment of the disclosure.

FIG. 3 is an exploded perspective view illustrating an inner structure of the electronic device of FIG. 1 according to an embodiment of the disclosure.

Referring to FIG. 3, an electronic device 300 may include a lateral bezel structure 310, a first support member 311 (e.g., a bracket), a front plate 320, a display 330, a Printed Circuit Board (PCB) 340, a battery 350, a second support member 360 (e.g., a rear case), an antenna 370, and a rear plate 380. In some embodiments, the electronic device 300 may omit at least one (e.g., the first support member 311) of these components, or may additionally include other components. At least one of the components of the electronic device 300 may be the same as or similar to at least one of the components of the electronic device 100 of FIG. 1 or 2, and redundant descriptions will be omitted hereinafter.

The first support member 311 may be coupled with the lateral bezel structure 310 by being disposed inside the electronic device 300, or may be constructed integrally with respect to the lateral bezel structure 310. The first support member 311 may be constructed of, for example, a metal material and/or non-metal material (e.g., polymer). The display 330 may be coupled to one side of the first support member 311, and the PCB 340 may be coupled to the other side thereof. A processor, a memory, and/or an interface may be mounted on the PCB 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, a Secure Digital (SD) card interface, and/or an audio interface. For example, the interface may electrically or physically couple the electronic device 300 and the external electronic device, and may include a USB connector, an SD card/MultiMedia Card (MMC) connector, or an audio connector.

As a device for supplying power to at least one component of the electronic device 300, the battery 350 may include, for example, a non-rechargeable primary cell, a rechargeable secondary cell, or a fuel cell. At least one portion of the battery 350 may be disposed on the same plane substantially with respect to, for example, the PCB 340. The battery 350 may be disposed integrally inside the electronic device 300, or may be detachably disposed with respect to the electronic device 300.

The antenna 370 may be disposed between the rear plate 380 and the battery 350. The antenna 370 may include, for example, a Near Field Communication (NFC) antenna, a wireless charging antenna, and/or a Magnetic Secure Transmission (MST) antenna. The antenna 370 may perform NFC, for example, with the external electronic device, or may wirelessly transmit/receive power required for charging. In another embodiment, an antenna structure may be constructed by at least part of the lateral bezel structure 310 and/or the first support member 311 or a combination thereof.

Figure 4:
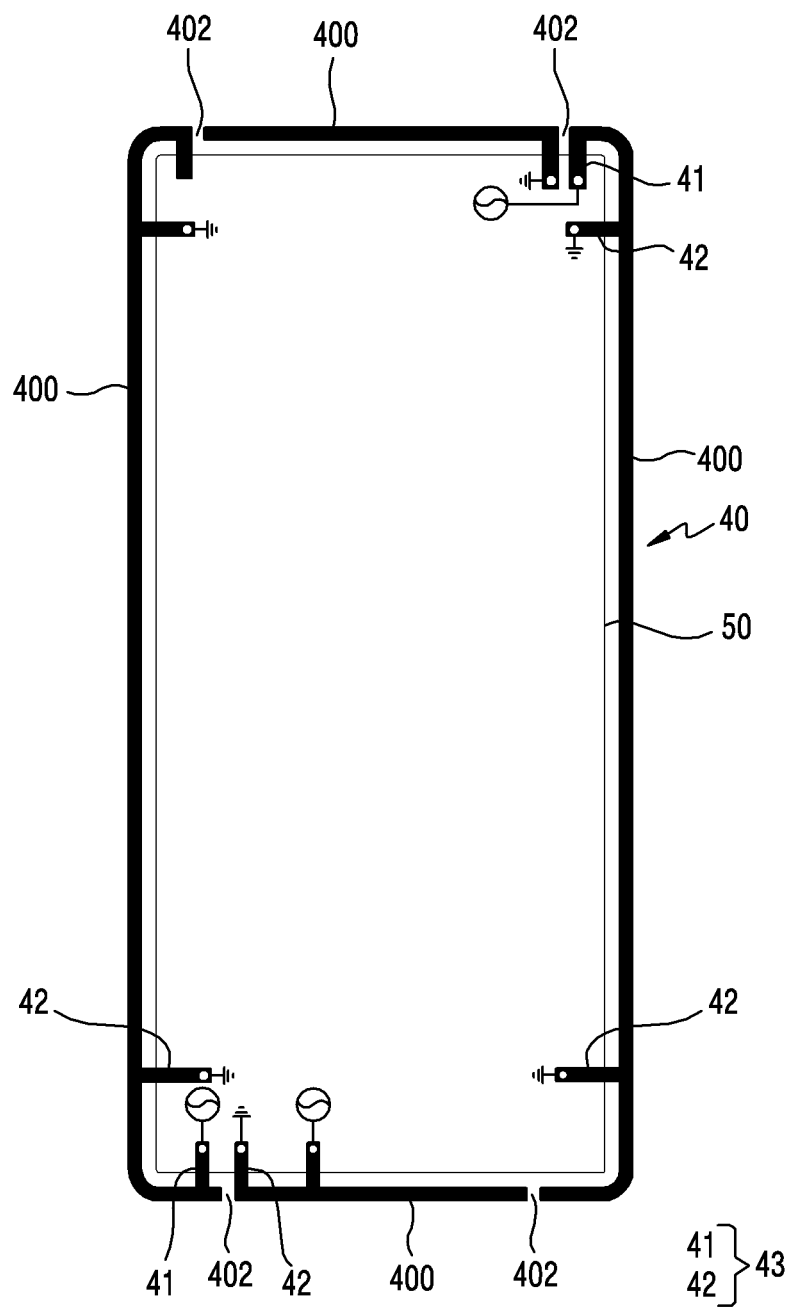
FIG. 4 is a plan view illustrating a structure of a side member mounted on an electronic device of FIG. 1 according to an embodiment of the disclosure.

FIG. 4 is a plan view illustrating a structure of a side member mounted on an electronic device of FIG. 1 according to an embodiment of the disclosure.

Referring to FIG. 4, an electronic device according to an embodiment (e.g., the electronic device 100 of FIG. 1) may include a housing (e.g., the housing 110 of FIG. 1). According to an embodiment, the housing may include a side member 40 (e.g., the lateral bezel structure 118 of FIG. 1) surrounding at least part of a space between a front plate (e.g., the front plate 102 of FIG. 1) and a rear plate (e.g., the rear plate 111 of FIG. 2).

According to an embodiment, the side member 40 may be formed of a metal material in part and may operate as an antenna radiator. According to an embodiment, the side member 40 may include a plurality of exterior metal frames 400, and may serve as an exterior of the electronic device.

According to an embodiment, the side member 40 may be configured in a segmented type. For example, the side member 40 may include at least one exterior metal frame 400 operating as an antenna radiator along a lengthwise direction, and at least one non-metal material portion 402 disposed between the exterior metal frames 400. For example, the non-metal material portion 402 may be an insulating material.

According to an embodiment, the side member 40 may include at least one first portion 43 to operate as an antenna radiator. According to an embodiment, the first portion 43 may include at least one feeding portion 41 and at least one ground portion 42. According to an embodiment, the at least one feeding portion 41 and the at least one ground portion 42 may be electrically coupled to a printed circuit board 50. According to an embodiment, a connection structure may be disposed between the printed circuit board 50 and the at least one feeding portion 41 and at least one ground portion 42.

Figure 5:
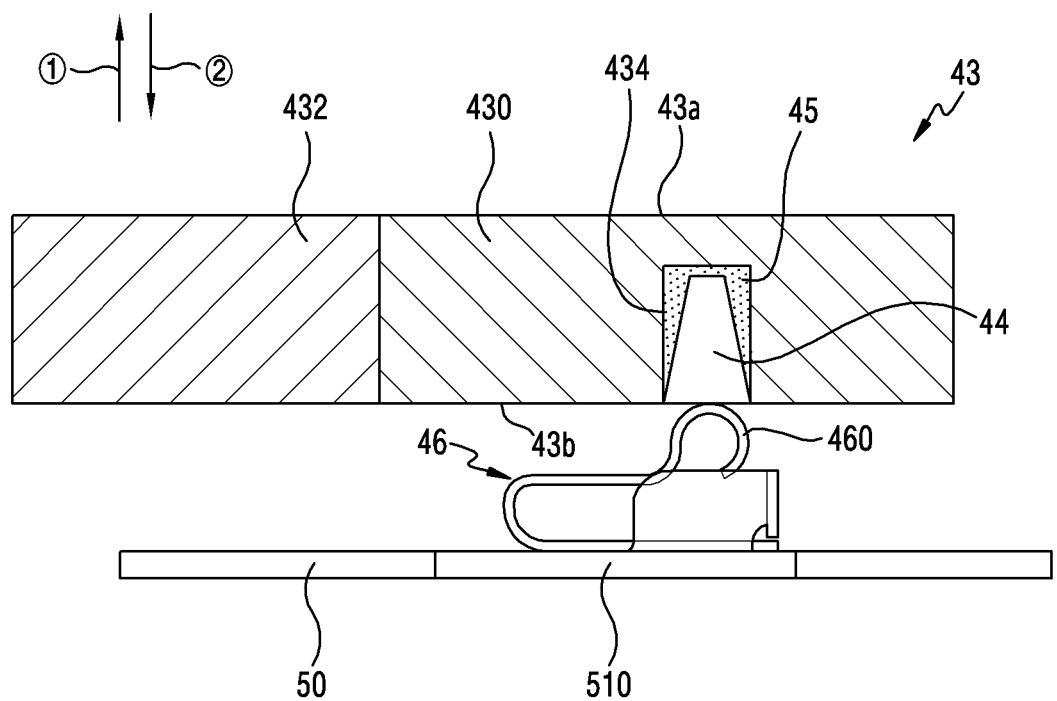
FIG. 5 is a cross-sectional view illustrating a conductive structure disposed between a side member and a printed circuit board according to an embodiment of the disclosure.

FIG. 5 is a cross-sectional view illustrating a conductive structure disposed between a side member and a printed circuit board according to an embodiment of the disclosure.

Referring to FIG. 5, the side member 40 according to an embodiment may include a first portion 43 protruding in a direction perpendicular to first and second directions ① and ② (e.g., the first and second directions ① and ② of FIG. 1). For example, the first portion 43 may be a metal structure 430 formed to protrude from the side member 40, and may be the feeding portion 41 or the ground portion 42. According to an embodiment, the first portion 43 may include a first face 43a facing the first direction ① and a second face 43b facing a second direction ② opposite to the first direction ①. According to an embodiment, the second face 43b may have a housing groove 434 formed to insert a conductive body 44. According to an embodiment, the housing groove 434 may be recessed in the second face 43b in the first direction ①. For example, the housing groove 434 may be formed with a drill tool or a Computer Numerical Control (CNC) device (not shown). For example, the housing groove 434 may be formed in a cylindrical shape, a polygonal pyramid, or a conical shape.

According to an embodiment, in the first portion 43 of a side member, the conductive body 44 may be bonded to the housing groove 434 through a press-fit process to construct a conductive structure. The conductive body 44 of the press-fitted conductive member may be completely housed in the housing groove 434, or may protrude in part. A connection structure (e.g. connection terminal 46) may be disposed between the conductive body 44 press-fitted to the housing groove 434 and the printed circuit board 50. One face of the press-fitted conductive body 44 may be co-planar with the second face 43b of the first portion 43.

According to an embodiment, the connection structure may use the C-clip type connection terminal 46. The connection terminal 46 may be mounted on the printed circuit board 50 and thus maintain a state of being connected to one face of the conductive body 44. According to an embodiment, the connection terminal 46 disposed on a connection pad 510 of the printed circuit board 50 may maintain a state of being connected to the conductive body 44 since a free end 460 thereof has elasticity.

According to an embodiment, a space between an inner portion of the housing groove 434 and the conductive body may be filled with an adhesive 45. According to an embodiment, the adhesive 45 may include a conductive material. A connection area may be increased between the conductive body 44 and the first portion 43 of the side member due to the adhesive including a conductive material. According to an embodiment, the housing groove 434 may be filled with the adhesive 45 to serve for a sealing function of the housing groove 434.

According to an embodiment, the first portion 43, i.e., the metal structure 430, of the side member 40 may be electrically coupled to the printed circuit board 50 by means of the conductive body 44, the adhesive 45, and the connection terminal 46.

Figure 6:
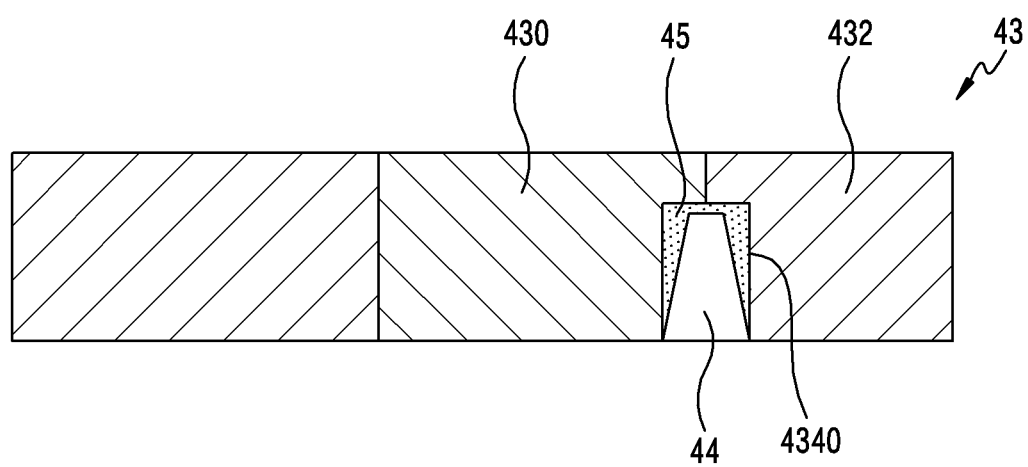
FIG. 6 is a cross-sectional view illustrating a different conductive structure formed on a portion of a side member according to an embodiment of the disclosure.

FIG. 6 is a cross-sectional view illustrating a different conductive structure formed on a portion of a side member according to an embodiment of the disclosure.

Referring to FIG. 6, a conductive structure formed on the first portion 43 according to an embodiment may be disposed between the metal structure 430 and a non-metal structure 432. According to an embodiment, a housing groove 4340 may be formed on a boundary portion of the metal structure 430 and the non-metal structure 423, and the conductive body 44 may be press-fitted to the housing groove 4340. The adhesive 45 may be applied to the housing groove 434 before the conductive member is press-fitted. For example, the metal structure 430 may be a portion of a side member (e.g., the lateral bezel structure 118 of FIG. 1) operating as an antenna radiator, and the non-metal structure 432 may be a portion of a support member (e.g., the first support member 311 of FIG. 3) as a polymer material.

FIGS. 7, 8, 9A, and 9B are cross-sectional views illustrating different conductive structures formed on a portion of a side member according to various embodiments of the disclosure.

Figure 7:
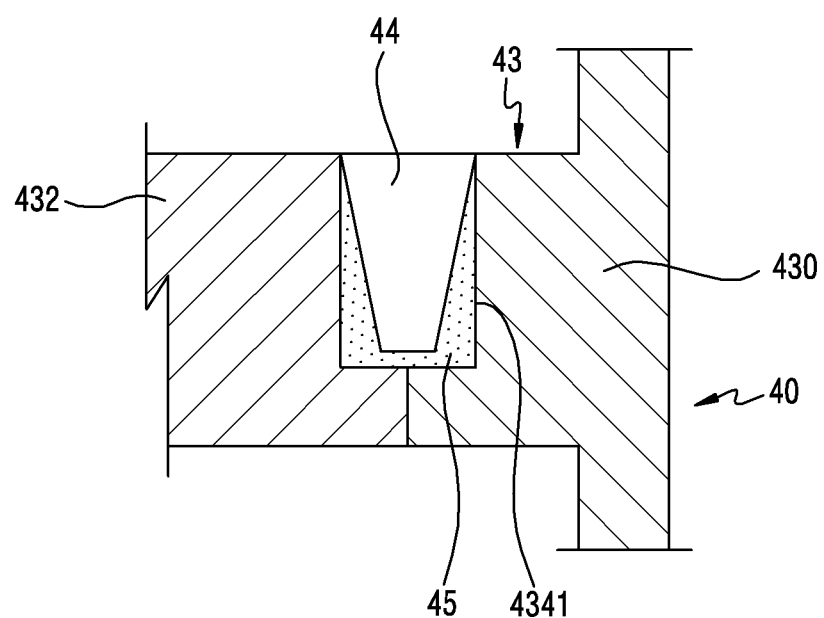
FIG. 7 is a cross-sectional view illustrating a different conductive structure formed on a portion of a side member according to an embodiment of the disclosure.

Referring to FIG. 7, a conductive structure formed on the first portion 43 of the side member 40 according to an embodiment may be located between the metal structure 430 located at one side and the non-metal structure 432 located at the other side. According to an embodiment, a housing groove 4341 may be formed on a boundary portion of the metal structure 430 and the non-metal structure 432. The housed conductive body 44 may be electrically coupled to the metal structure 430. According to an embodiment, the metal structure 430 may be a portion of the side member 40 operating as an antenna radiator, and the non-metal structure 432 may be a portion of a support member as a polymer material. According to an embodiment, the metal structure 430 may be disposed in parallel with the non-metal structure 432, as a feeding portion (e.g., the feeding portion 41 of FIG. 4) or ground portion (e.g., the ground portion 42 of FIG. 4) of the side member 40 operating as an antenna radiator.

Figure 8:
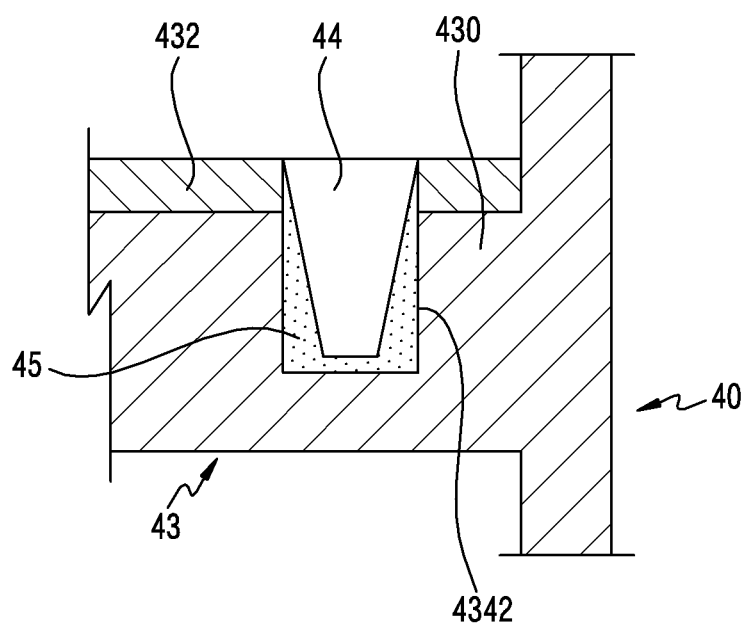
FIG. 8 is a cross-sectional view illustrating a different conductive structure formed on a portion of a side member according to an embodiment of the disclosure.

Referring to FIG. 8, a conductive structure formed on the first portion 43 of the side member 40 according to an embodiment may include the metal structure 430 located at an upper portion, the non-metal structure 432 located at a lower portion, a housing groove 4342 formed across the upper metal structure 430 and the non-metal structure 432, and the conductive body 44 press-fitted to the housing groove 4342. For example, the metal structure 430 may be a portion of the side member 40 of the antenna radiator, and the non-metal structure 432 may be a portion of a support member as a polymer material. According to an embodiment, the metal structure 430 may be disposed below the non-metal structure 432, as the feeding portion 41 or ground portion 42 of the side member 40 operating as the antenna radiator. According to an embodiment, the metal structure 430 and the non-metal structure 432 which is located at the lower portion may be configured by changing their locations from each other.

Figure 9A:
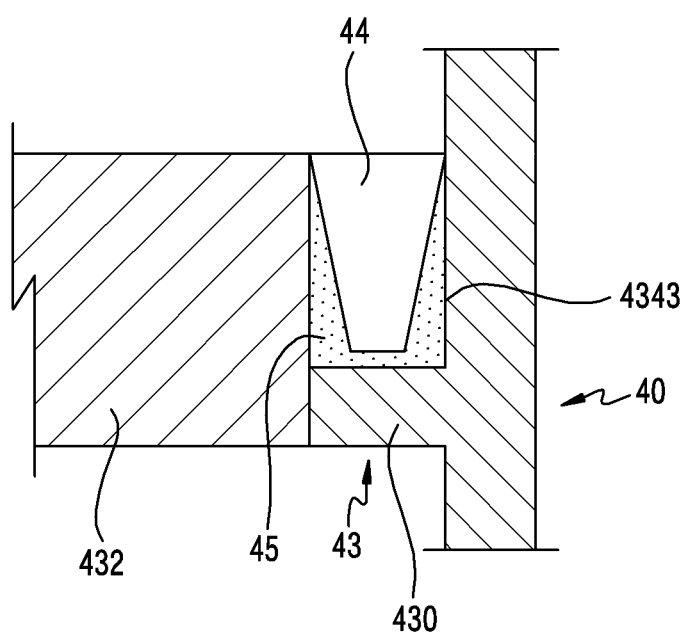
FIG. 9A is a cross-sectional view illustrating a different conductive structure formed on a portion of a side member according to an embodiment of the disclosure.

Referring to FIG. 9A, the conductive structure formed on the first portion 43 of the side member 40 according to an embodiment may be located between the metal structure 430 of the stepped metal structure 430 adjacent to the side member 40 located at an exterior and the non-metal structure 432 bonded to the metal structure 430. According to an embodiment, a housing groove 4343 may be formed on a boundary portion of the stepped shaped metal structure 430 adjacent to the exterior and the non-metal structure 432. The housed conductive body 44 may be electrically coupled to the metal structure 430. According to an embodiment, the conductive structure may include the housing groove 4343 formed across the metal structure 430 and the non-metal structure 432, and the conductive body 44 press-fitted to the housing groove 4343. For example, the metal structure 430 may be a portion of the side member 40 of the antenna radiator, and the non-metal structure 432 may be a portion of a support member as a polymer material. According to an embodiment, the metal structure 430 may be disposed in parallel with the non-metal structure 432, as a feeding portion (e.g., the feeding portion 41 of FIG. 4) or ground portion (e.g., the ground portion 42 of FIG. 4) operating as the antenna radiator.

Figure 9B:
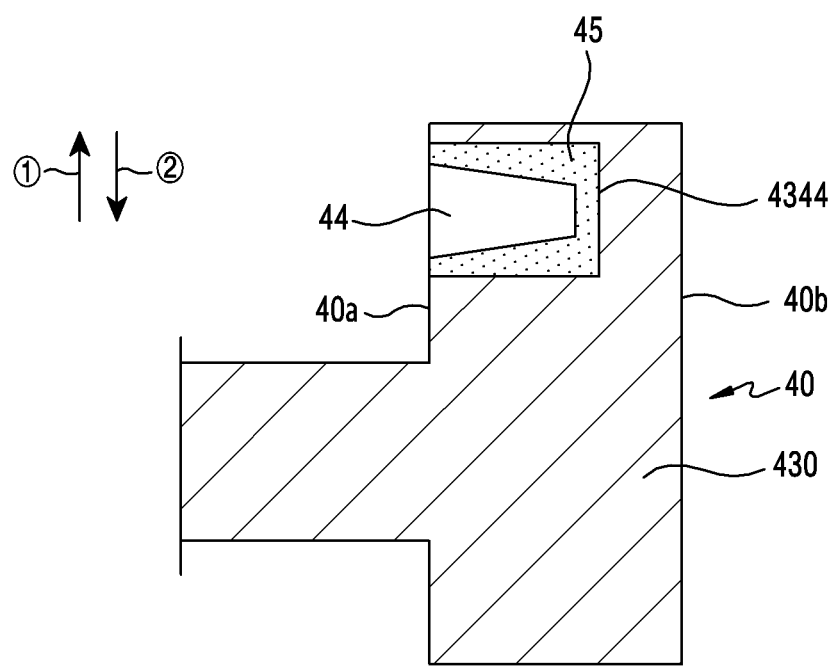
FIG. 9B is a cross-sectional view illustrating a different conductive structure formed on a portion of a side member according to an embodiment of the disclosure.

Referring to FIG. 9B, a conductive structure according to an embodiment may be formed directly on the side member 40. According to an embodiment, the side member 40 may include an inner face 40a and an outer face 40b, and a housing groove 4344 to which the conductive body 44 is press-fitted may be formed on the inner face 40a. According to an embodiment, the housing groove 4344 may be formed to be recessed in a direction perpendicular to each of first and second directions ① and ②. According to an embodiment, the housing groove 4344 may have a cylindrical shape, a conical shape, or a truncated conical shape.

According to an embodiment, a space between an inner portion of the housing groove 4344 and the conductive body 44 may be filled with the adhesive 45. According to an embodiment, the adhesive 45 may include a conductive material. A connection area may be increased between the conductive body 44 and the side member 40 due to the adhesive 45 including the conductive material. According to an embodiment, the housing groove 434 may be filled with the adhesive 45 to serve for a sealing function of the housing groove 434.

According to an embodiment, the conductive structure formed through the press-fit process between the conductive body 44 and the housing groove 434 may not only be utilized as a connection structure between a printed circuit board and a side member operating as an antenna radiator but also be equally applied to a conductive structure for an electrical connection between the printed circuit board and a circuitry, a conductive structure for an electronic connection between the printed circuit board and an antenna such as NFC, or a conductive structure for an electrical connection between the printed circuit board and a portion of a conductive structure disposed inside a housing.

According to an embodiment, a conductive structure formed between the conductive body 44 and the housing groove 434 through the press-fit process may be equally applied to a conductive structure for an electrical connection between the printed circuit board and a metallic structure disposed to the rear side (e.g., the metallic back cover) of the electronic device.

FIGS. 10A to 10E are cross-sectional views sequentially illustrating methods of manufacturing a conductive structure disposed to a side member according to various embodiments of the disclosure.

A process of manufacturing a conductive structure formed on a side member (e.g., the side member 40 of FIG. 3) according to an embodiment will be described referring to FIGS. 10A to 10E. The conductive structure may be a device for electrically connecting a first portion (e.g., the first portion 43 of FIG. 4) of a side member operating as an antenna radiator to a connection terminal (e.g., the connection terminal 46 of FIG. 5) mounted on the printed circuit board 50.

Figure 10A:
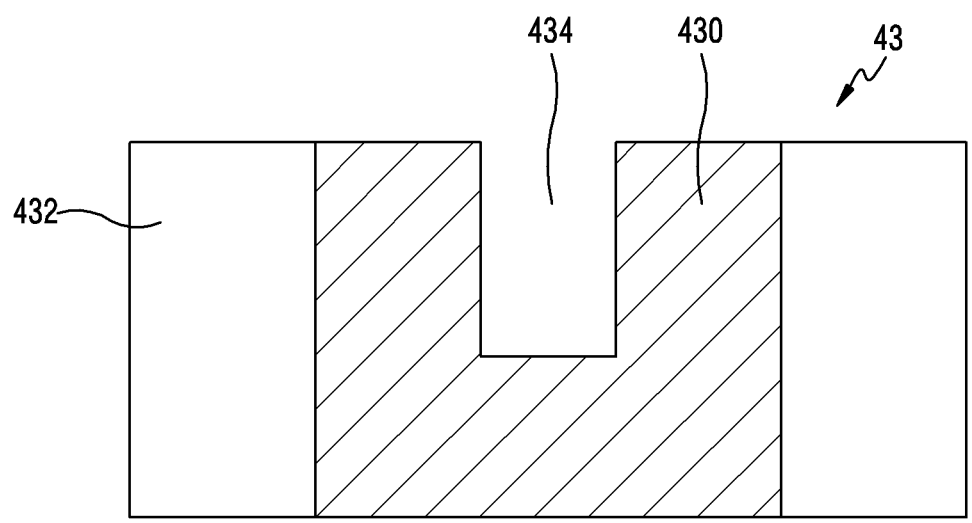
FIG. 10A is cross-sectional view illustrating a method of manufacturing a conductive structure disposed to a side member according to an embodiment of the disclosure.

Referring to FIG. 10A, the housing groove 434 may be formed on the metal structure 430 according to an embodiment through a drill (not shown) or CNC processing. For example, the housing groove 434 may include a cylindrical shape. The reference numeral 432 may refer to a non-metal structure.

Figure 10B:
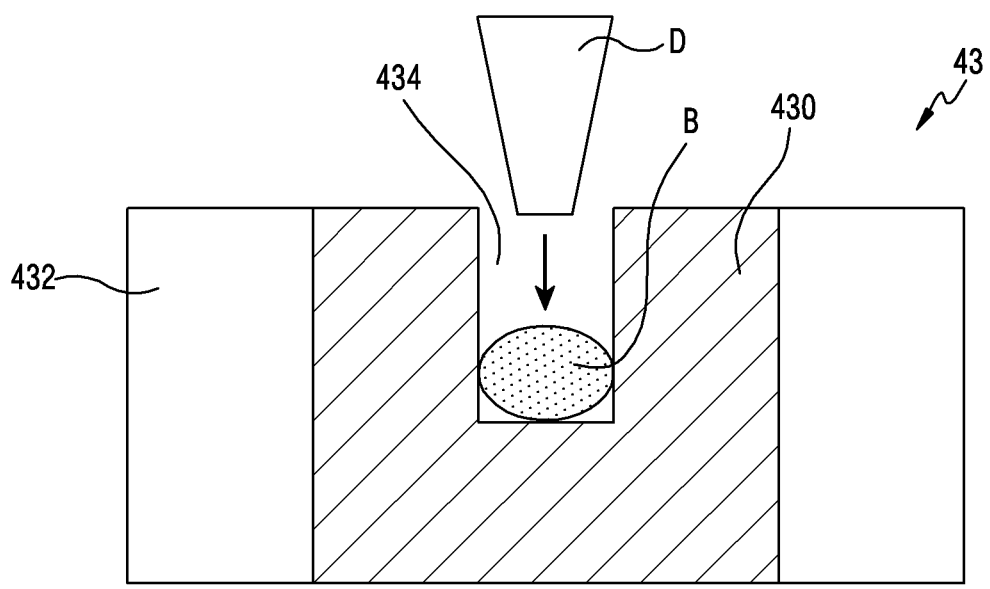
FIG. 10B is cross-sectional view illustrating a method of manufacturing a conductive structure disposed to a side member according to an embodiment of the disclosure.

Referring to FIG. 10B, a dispenser D may be located on the housing groove 434 according to an embodiment, and thereafter an adhesive solution B may be applied into the housing groove 434. The adhesive solution B to be applied is necessary in amount as much as filling part of a volume of the housing groove 434. According to an embodiment, the adhesive solution B may include a conductive material. According to an embodiment, the applied adhesive solution B may be part of a conductive structure after curing, and may be part of a sealing structure which seals the housing groove 434. According to an embodiment, the adhesive solution B may be cured through natural curing, moisture curing, or thermal curing.

Figure 10C:
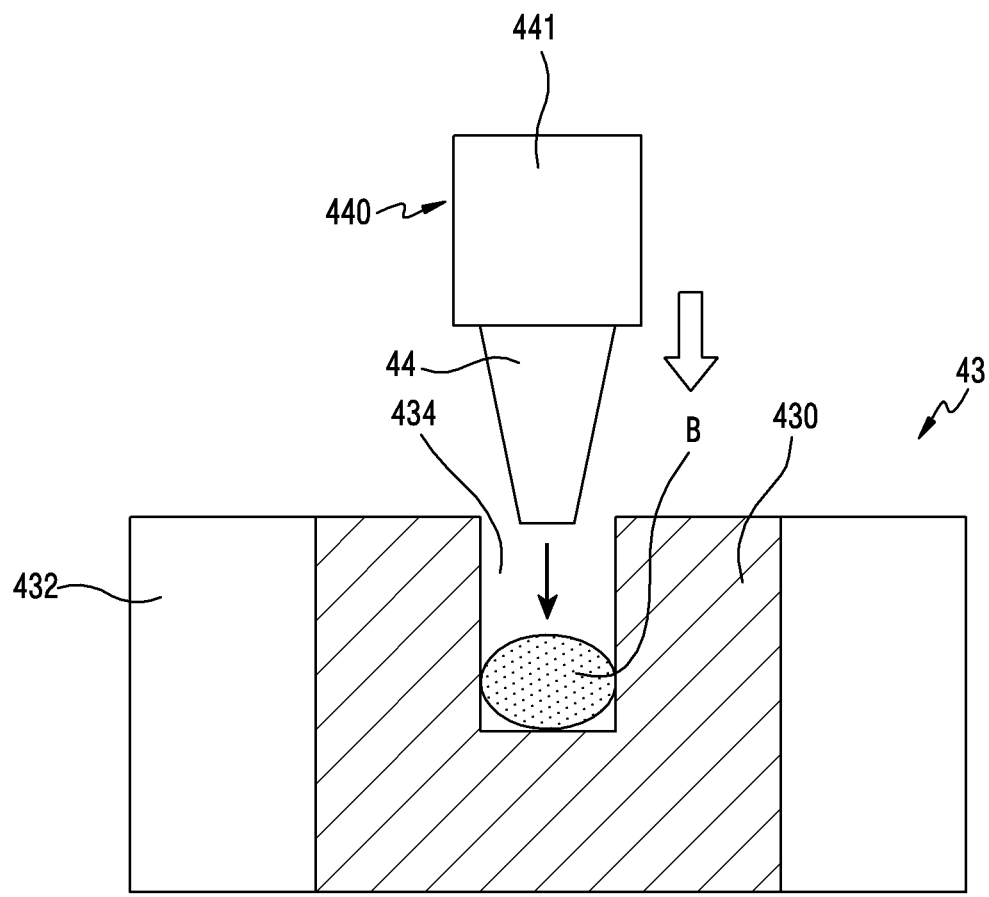
FIG. 10C is cross-sectional view illustrating a method of manufacturing a conductive structure disposed to a side member according to an embodiment of the disclosure.

Referring to FIG. 10C, a prepared conductive member 440 may be picked to be disposed on the housing groove 434. The prepared conductive member 440 may include the conductive body 44 and a conductive inserting head 441. According to an embodiment, the conductive body 44 may be a portion which is conducted by being inserted to the housing groove 434, and the conductive inserting head 441 may be a portion to be inserted to a press-fit device (not shown). According to an embodiment, the conductive inserting head 441 may be extended from the conductive body 44. A diameter of the conductive inserting head 441 may be greater than a diameter of the housing groove 434. For example, the conductive body 44 may be formed in any one of a cylindrical shape, a truncated conical shape, a square pillar shape, a polygonal pillar shape, and a polygonal pyramid shape. According to an embodiment, the conductive body 44 may use a material having lower strength or hardness than a metal structure having the housing groove 434 formed thereon. According to an embodiment, the conductive structure (e.g. metal structure 430) and the conductive body 44 may be formed of identical or different materials.

Figure 10D:
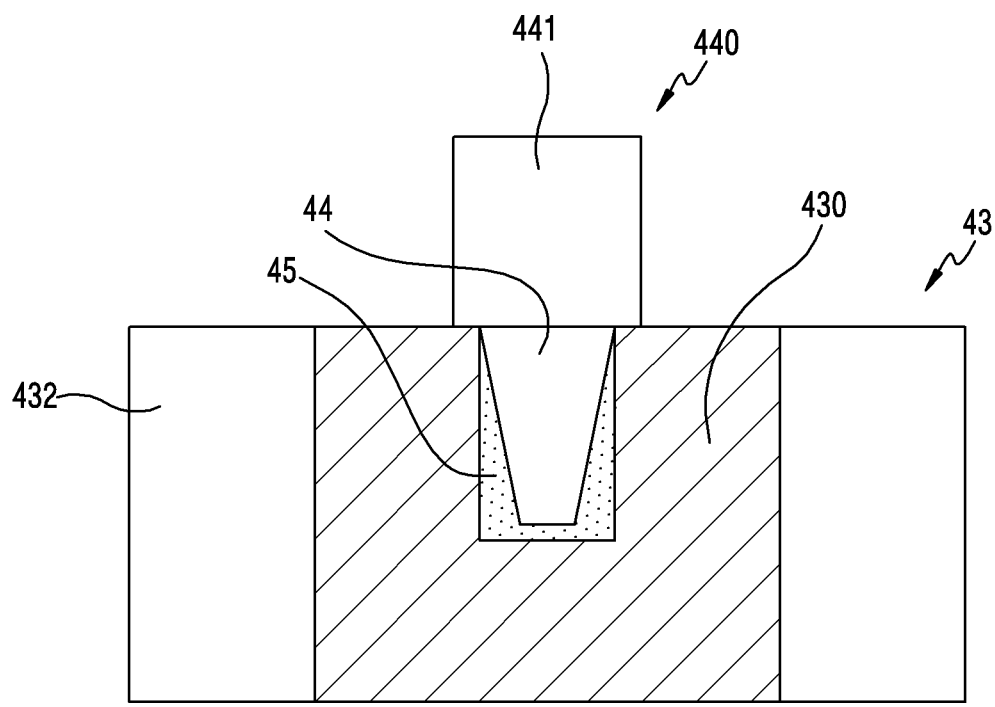
FIG. 10D is cross-sectional view illustrating a method of manufacturing a conductive structure disposed to a side member according to an embodiment of the disclosure.

Referring to FIG. 10D, a prepared conductive member may be press-fitted to the housing groove 434 by using a press-fit device. In a press-fit process, only the conductive body 44 of the conductive member may be press-fitted to the housing groove 434 and thus may be closely in contact with an inner face of the housing groove 434. According to an embodiment, a space between the conductive body 44 and an inner face of the housing groove 434 may be filled with the adhesive 45. An inner portion of the housing groove 434 may be sealed by the applied adhesive 45.

Figure 10E:
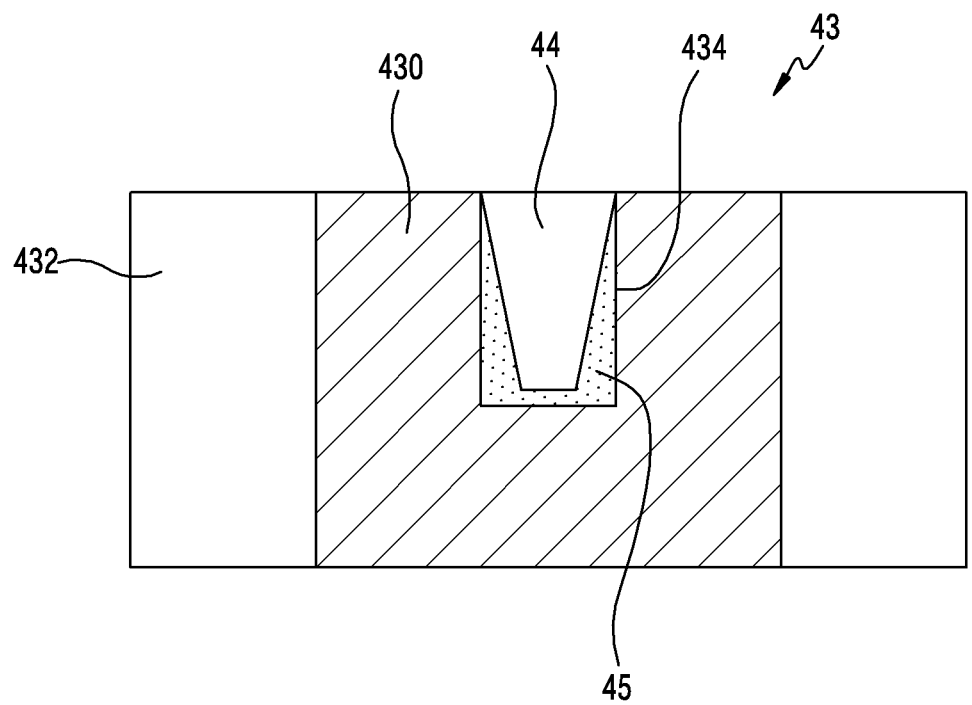
FIG. 10E is cross-sectional view illustrating a method of manufacturing a conductive structure disposed to a side member according to an embodiment of the disclosure.

Referring to FIG. 10E, the conductive inserting head 441 of the press-fitted conductive member 440 may be cut, and a cut face of the conductive body 44 may be a connection face. According to an embodiment, the cut face may be co-planner with one face of the metal structure 430.

Figure 11A:
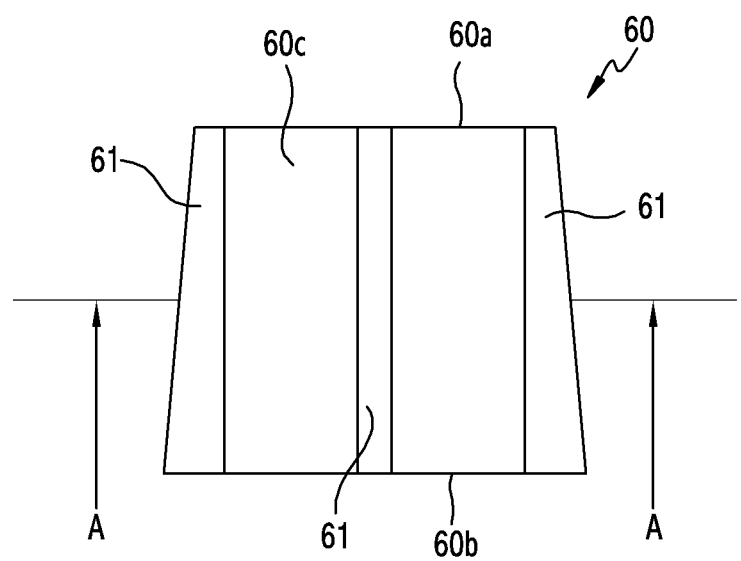
FIG. 11A is a front view illustrating a conductive body of a conductive member according to an embodiment of the disclosure.

FIG. 11A is a front view illustrating a conductive body of a conductive member according to an embodiment of the disclosure.

Figure 11B:
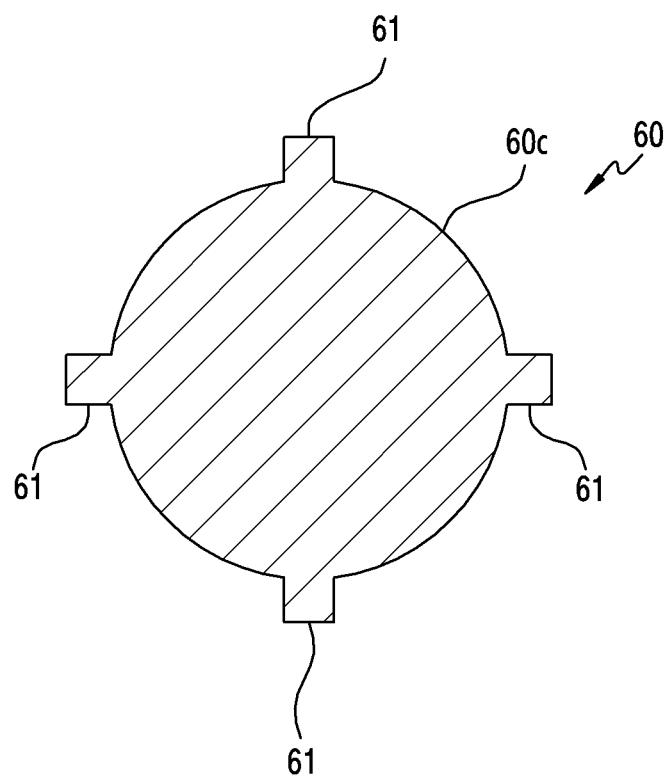
FIG. 11B is a cross-sectional view, cut along the ling A-A' of FIG. 11A according to an embodiment of the disclosure.

FIG. 11B is a cross-sectional view, cut along the ling A-A' of FIG. 11A according to an embodiment of the disclosure.

Referring to FIGS. 11A and 11B, a conductive body 60 of a conductive member according to an embodiment may have at least one protrusion 61 formed on an outer circumferential face 60*c*. According to an embodiment, the at least one protrusion 61 is for facilitating deformation in a press-fit process of the conductive member. The deformation of the protrusion 61 may result in improvement of a mechanical and electrical contact between a housing groove (e.g., the housing groove 434 of FIG. 6) and the conductive body 60.

According to an embodiment, the conductive body 60 of a cylindrical shape, a square pyramid shape, a polygonal pyramid shape, or a truncated conical shape may include a first face 60*a* facing the housing groove and a second face 60*b* facing away from the first face 60*a*. According to an embodiment, the at least one protrusion 61 may be deformed by being pressed with the housing groove in a press-fit process, so that a metal structure (e.g., the metal structure 430 of FIG. 5) of a first portion is closely in contact with the conductive body 44.

According to an embodiment, the at least one protrusion 61 may be extended from the first face 60*a* to the second face 60*b*. According to an embodiment, the at least one protrusion 61 may be extended in a linear shape. According to an embodiment, a thickness and width of each of the protrusions 61 may be formed to be uniform or not uniform. According to an embodiment, each of the protrusions 61 may protrude outwardly from the outer circumferential face 60*c* of the conductive body 60.

In an embodiment, the outer circumferential face of the conductive body 60 may be coated with any one material among metal with corrosion resistance, polymer having conductivity, and an inorganic material having conductivity. For example, the outer face may include the first face 60*a*, the second face 60*b*, and the outer circumferential face 60*c*.

Figure 12:
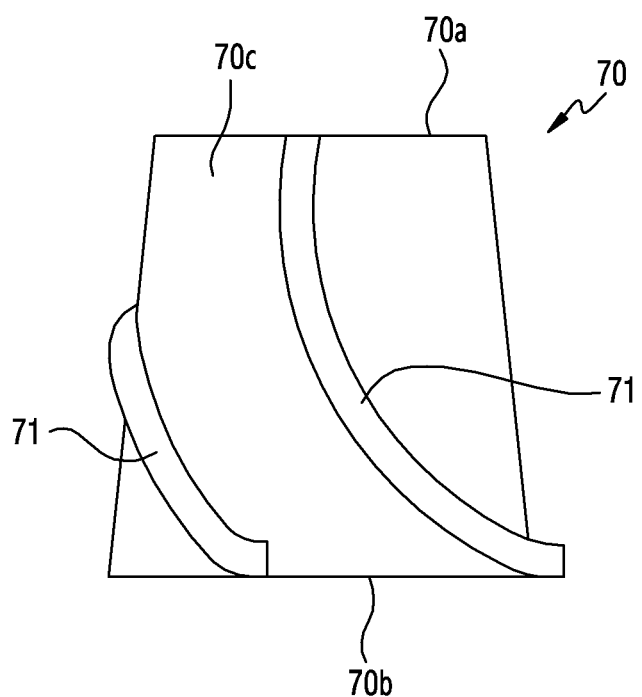
FIG. 12 is a front view illustrating a conductive body of a conductive member according to an embodiment of the disclosure.

FIG. 12 is a front view illustrating a conductive body of a conductive member according to an embodiment of the disclosure.

Referring to FIG. 12, a conductive body 70 of a conductive member according to an embodiment may have at least one protrusion 71 formed on an outer circumferential face 70c. According to an embodiment, the conductive body 70 may include a first face 70a facing a housing groove and a second face 70b facing away from the first face 70a. According to an embodiment, the at least one protrusion 71 may be deformed by being pressed with the housing groove in a press-fit process so as to increase a contact area between a metal structure (e.g., the metal structure 430 of FIG. 5) and the conductive body 70.

According to an embodiment, the at least one protrusion 71 may be extended from the first face 70a to the second face 70b. According to an embodiment, the at least one protrusion 71 may be extended in a curved shape. According to an embodiment, the at least one protrusion 71 may be formed in a spiral shape on the outer circumferential face 70c of the conductive body 70. According to an embodiment, a thickness and width of each of the protrusions 71 may be formed to be uniform or not uniform. According to an embodiment, each of the protrusions 71 may protrude outwardly from the outer circumferential face 70c of the conductive body 70.

In an embodiment, the outer circumferential face of the conductive body 70 may be coated with any one material among metal with corrosion resistance, polymer having conductivity, and an inorganic material having conductivity. For example, the outer face may include the first face 70a, the second face 70b, and the outer circumferential face 70c.

Figure 13A:
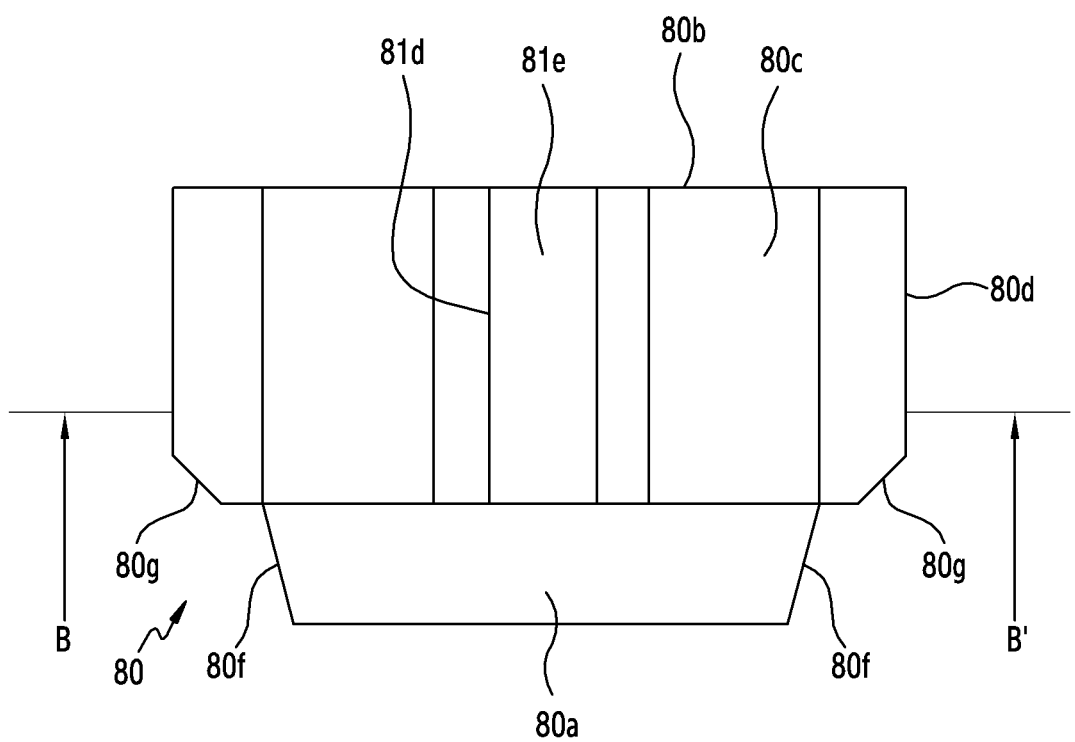
FIG. 13A is a front view illustrating a conductive body of a conductive member according to an embodiment of the disclosure.

FIG. 13A is a front view illustrating a conductive body of a conductive member according to an embodiment of the disclosure.

Figure 13B:
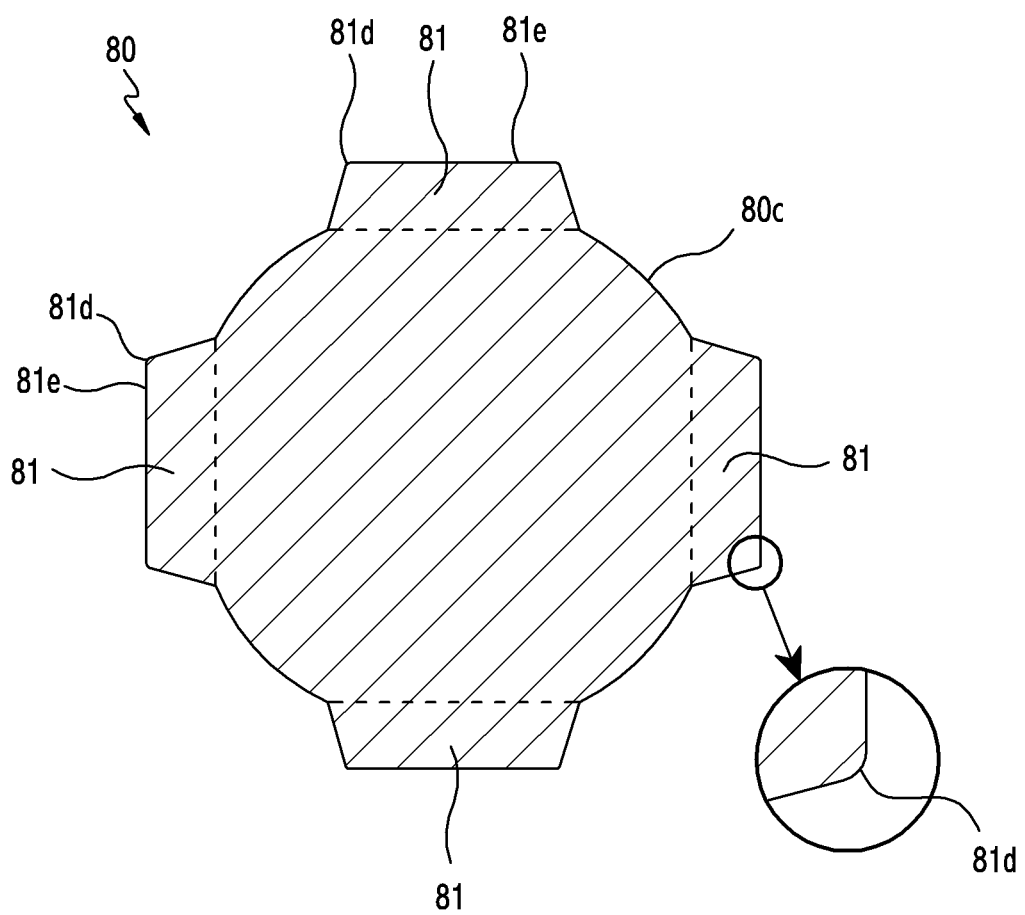
FIG. 13B is a cross-sectional view, cut along the line B-B' of FIG. 13A according to an embodiment of the disclosure.

FIG. 13B is a cross-sectional view, cut along the line B-B' of FIG. 13A according to an embodiment of the disclosure.

Referring to FIGS. 13A and 13B, according to an embodiment, a conductive body 80 may include a bottom portion 80a and a top portion 80b. According to an embodiment, the bottom portion 80a may be formed to be flat, and thus may facilitate to ensure flatness when a housing groove is press-fitted.

According to an embodiment, the conductive body 80 may have at least one protrusion 81 formed partially on an outer circumferential face 80c. For example, four protrusions 81 may be formed symmetrically on the outer circumferential face 80c of the conductive body 80. According to an embodiment, the at least one protrusion 81 may be extended from the outer circumferential face 80c of the conductive body in a linear shape from the top portion 80b to the bottom portion 80a. For example, each of the protrusions 81 may be formed with equal intervals on the outer circumferential face.

According to an embodiment, the protrusion 81 may process a corner portion 81d in a round shape so that the conductive body 80 is easily deformed, and a burr shape is minimized when the conductive body 80 is deformed.

According to an embodiment, the conductive body 80 may form a first face 81e of the protrusion 81 in a linear shape to increase a contact area with respect to a housing groove. According to an embodiment, the conductive body 80 may form tapered first and second inclined faces 80f and 80g to facilitate location correction when it is press-fitted with the conductive body. According to an embodiment, the first inclined face 80f may be produced in such a shape that a side face of the bottom portion 80a is an inclined face or a tapered face. According to an embodiment, the second inclined face 80g may be formed at a lower end of each of the protrusions 81.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a housing comprising:
        a front plate facing a first direction,
        a rear plate facing a second direction opposite to the first direction, and
        a metal member surrounding at least part of a space between the front plate and the rear plate and operating as an antenna radiator;
    a support member comprising:
        a first face facing the first direction, and
        a second face facing the second direction, disposed between a display and the rear plate, supporting the display on the first face, and bonded to part of the metal member;
    a printed circuit board disposed between the support member and the rear plate, and supported on the second face;
    a housing groove formed on a first portion of the metal member;
    a conductive body bonded to the housing groove through a press-fit process; and
    a connection terminal disposed on the printed circuit board and electrically coupling the press-fitted conductive body to the printed circuit board.

2. The electronic device of claim 1,
    wherein the conductive body further comprises a conductive inserting head inserted into a press-fit device, and
    wherein the conductive inserting head is removed after the press-fit process.

3. The electronic device of claim 2, wherein the conductive body is formed in any one of a cylindrical shape, a truncated conical shape, a square pyramid shape, or a polygonal pyramid shape.

4. The electronic device of claim 2, wherein the conductive body has at least one protrusion formed on an outer circumferential face thereof.

5. The electronic device of claim 4,
    wherein, when the conductive body is press-fitted, the at least one protrusion is deformed due to the pressing with the housing groove, and
    wherein the at least one protrusion is fitted between the housing groove and the conductive body.

6. The electronic device of claim 4,
    wherein the at least one protrusion comprises:
        a first face facing the housing groove, and
        a second face facing away from the first face,
    wherein each of the at least one protrusion is formed on an outer circumferential face of the conductive body, and
    wherein each of the at least one protrusion is extended linearly from the first face toward the second face.

7. The electronic device of claim 4,
    wherein the at least one protrusion comprises:
        a first face facing the housing groove, and
        a second face facing away from the first face,
    wherein the at least one protrusion is formed on an outer circumferential face of the conductive body, and
    wherein the at least one protrusion is extended in a curved shape from the first face toward the second face.

8. The electronic device of claim 7, wherein the curved shape comprises a spiral shape.

9. The electronic device of claim 2, wherein the conductive body is coated with any one of metal having corrosion resistance, polymer having conductivity, or an inorganic material having conductivity.

10. The electronic device of claim 1, wherein the housing groove is formed in a substantially cylindrical shape.

11. The electronic device of claim 1,
wherein the metal member comprises:
a first face facing the first direction; and
a second face facing the second direction, and
wherein the housing groove is recessed in the first direction on the second face.

12. The electronic device of claim 2, wherein an adhesive is applied to the housing groove before the conductive body is press-fitted.

13. The electronic device of claim 12, wherein the adhesive applied to the housing groove serves for a sealing function of the press-fitted conductive body.

14. The electronic device of claim 13, wherein the adhesive comprises a conductive material.

15. The electronic device of claim 1, wherein a first portion of the metal member faces a direction perpendicular to the first and second directions, respectively.

16. The electronic device of claim 15, wherein the first portion of the metal member is extended from the metal member toward an inside of the housing.

17. The electronic device of claim 16, wherein the first portion of the metal member operates as a feeding portion or a ground portion.

18. The electronic device of claim 1,
wherein the first portion of the metal member comprises:
a metal structure extended from a member located at an exterior toward an inside of the housing, and
a non-metal structure extended from the metal structure and bonded to the metal structure, and
wherein the housing groove is formed on at least one of the metal structure or the non-metal structure.

19. An electronic device comprising:
a housing comprising:
a front plate facing a first direction,
a rear plate facing a second direction opposite to the first direction, and
a metal member surrounding at least part of a space between the front plate and the rear plate, operating as an antenna radiator, and comprising at least one feeding portion or at least one ground portion protruding in a direction perpendicular to the first and second directions;
a support member disposed between a display and the rear plate, supporting the display in the first direction, and bonded to at least part of the metal member;
a printed circuit board disposed between the support member and the rear plate, and supported by the support member;
a housing groove formed on the metal member;
a conductive body bonded to the housing groove through a press-fit process; and
a connection terminal disposed on the printed circuit board to electrically couple the press-fitted conductive body to the printed circuit board.

20. The electronic device of claim 19,
wherein the conductive body has at least one protrusion formed thereon,
wherein the at least one protrusion comprises:
a first face facing the housing groove, and
a second face facing away from the first face, and
wherein the protrusion is extended from the first face toward the second face in a linear or curved shape.

* * * * *